(12) United States Patent
Werlau

(10) Patent No.: US 6,750,752 B2
(45) Date of Patent: Jun. 15, 2004

(54) HIGH POWER WIDEBAND BALUN AND POWER COMBINER/DIVIDER INCORPORATING SUCH A BALUN

(75) Inventor: Glenn Werlau, Patterson, NY (US)

(73) Assignee: Werlatone, Inc., Brewster, NY (US)

( * ) Notice: Subject to any disclaimer, the term of this patent is extended or adjusted under 35 U.S.C. 154(b) by 64 days.

(21) Appl. No.: 10/288,325

(22) Filed: Nov. 5, 2002

(65) Prior Publication Data

US 2004/0085176 A1 May 6, 2004

(51) Int. Cl.[7] .............................. H01F 27/28; H01H 5/00
(52) U.S. Cl. ......................................... 336/229; 333/25
(58) Field of Search .............................. 336/229, 180; 333/25, 131, 32, 112, 119

(56) References Cited

U.S. PATENT DOCUMENTS

| 4,922,204 | A | * | 5/1990 | Duerr et al. ................ 324/322 |
|---|---|---|---|---|
| 5,121,090 | A | | 6/1992 | Garuts et al. |
| 5,200,718 | A | * | 4/1993 | Kato ............................ 333/25 |
| 5,296,823 | A | | 3/1994 | Dietrich |
| 5,977,842 | A | | 11/1999 | Brown et al. |
| 6,100,772 | A | * | 8/2000 | Decramer et al. ............ 333/25 |
| 6,111,465 | A | * | 8/2000 | Kakuta et al. .............. 330/276 |
| 6,217,790 | B1 | | 4/2001 | Onizuka et al. |
| 6,414,476 | B2 | * | 7/2002 | Yagi ........................... 324/127 |
| 6,441,696 | B1 | | 8/2002 | Westberg |

* cited by examiner

Primary Examiner—Anh Mai
(74) Attorney, Agent, or Firm—St. Onge Steward Johnson & Reens LLC

(57) ABSTRACT

A balun transformer includes a coaxial transmission line terminating at one end with balanced terminals and terminating at another end with unbalanced terminals. At least two impedance segments are connected in series between the balanced terminals and the unbalanced terminals, each of the at least two impedance segments being formed by a magnetic core and at least one winding of the coaxial transmission line wound about the magnetic core.

28 Claims, 3 Drawing Sheets

HIGH POWER WIDEBAND BALUN AND POWER COMBINER/DIVIDER INCORPORATING SUCH A BALUN

FIELD OF THE INVENTION

The present invention relates generally to a 1:1 unbalanced to balanced transmission line transformer (commonly known as a balun).

BACKGROUND OF THE INVENTION

High frequency electric signals can be transmitted in two often occurring ways, namely in balanced and unbalanced transmissions. Unbalanced transmission lines use coaxial cable and signals are transmitted via transmission line mode. Current flows in one direction on the center conductor and in the opposite direction on the inside surface of the outer conductor (shield). The outer conductor is normally connected to ground.

Balanced and unbalanced transmissions are often mixed in various applications, such as in radio systems. It is therefore necessary to enable a balanced signal to be converted to an unbalanced signal, and vice versa, with the smallest losses possible. Baluns are used to this end.

The 1:1 Balun transformer has been known for some time and much information can be found on the subject. For example, Jerry Sevick has covered the subject extensively in his book titled "Transmission Line Transformers", 2d Edition, 1990; Published by the American Radio Relay League.

FIG. 1 shows a prior art balun 10, employing a multiple turn coaxial transmission line winding 12, with a center conductor 14 and an outer conductor 16 wound on a toroidal ferrite core 18. Terminals 20 and 22 are the balanced end terminals, while 20a and 22a form the unbalanced terminals of balun 10. Terminal 22a is connected to common ground.

Thus, a typical transmission line balun consists of several turns of either bifilar or coaxial transmission line wound on a high permeability magnetic core such as ferrite. The high longitudinal impedance between the ends of the windings isolate the balanced from the unbalanced end of the balun, choking off the flow of non-transmission line current. The useful low frequency response of the balun is limited to that frequency where inadequate choking inductance allows the flow of conventional current on the windings.

The upper frequency response is limited by (i) the match between transmission line and load impedance, (ii) undesired parasitic effects and (iii) resonances in the pass band which limit the electrical length of the winding. The upper frequency requirement for a practical balun will dictate an electrical length in the order of about 0.1 wavelength, limiting the number of turns on the core. The useful low frequency is then limited by the choice of core material, and the choking inductance produced by the limited number of turns. High power baluns of a kilowatt or more have a typical useful bandwidth of about 20:1.

What is desired, therefore, is a very high power, ultra wideband balun featuring parasitic reduction and techniques to extend both the high and low frequency ends of the useful range.

SUMMARY OF THE INVENTION

Accordingly, it is an object of the present invention to provide an ultra wideband high power transmission line balun transformer.

Another object of the present invention is to provide a balun transformer having the above characteristics and which may be scaled to accommodate very high power levels.

A further object of the present invention is to provide a balun transformer having the above characteristics and which exhibits low loss and low voltage standing wave ratio (VSWR) characteristics.

Still another object of the present invention is to provide a balun transformer having the above characteristics and which employs a method of reducing frequency limiting parasitic effects.

Yet a further object of the present invention is to provide a balun transformer having the above characteristics and which incorporates resonance suppression techniques.

Still a further object of the present invention is to provide a balun transformer having the above characteristics and which has an electrical length that is not limited to a fraction of a wavelength.

Yet still another object of the present invention is to provide a balun transformer having the above characteristics and which employs a method of increasing the low frequency longitudinal impedance thereof.

Yet still a further object of the present invention is to provide a balun transformer having the above characteristics and which employs a method of reducing the resistive loss component of the longitudinal impedance therein.

These and other objects of the present invention are achieved by provision of a balun transformer which includes a coaxial transmission line terminating at one end with balanced terminals and terminating at another end with unbalanced terminals. At least two impedance segments are connected in series between the balanced terminals and the unbalanced terminals, each of the at least two impedance segments being formed by a magnetic core and at least one winding of the coaxial transmission line wound about the magnetic core.

Preferably, each of the magnetic cores is toroidal in shape. It is also preferable that each of the magnetic cores is formed from a ferrite material.

Preferably, the at least two impedance segments comprises a first impedance segment connected to the balanced terminals and a second impedance segment connected between the first impedance segment and the unbalanced terminals, and wherein a number of windings of the coaxial transmission line wound about the core of the second impedance segment is greater than a number of windings of the coaxial transmission line wound about the core of the first impedance segment. In this case, it is also preferable that the core of the second impedance segment has a permeability greater than or equal to a permeability of the core of the first impedance segment and exhibits a loss characteristic greater than or equal to a loss characteristic of the core of the first impedance segment.

Most preferably, a third impedance segment is connected between the second impedance segment and the unbalanced terminals, and wherein a number of windings of the coaxial transmission line wound about the core of the third impedance segment is greater than or equal to a number of windings of the coaxial transmission line wound about the core of the second impedance segment. In this case it is also preferable that the core of the third impedance segment has a permeability approximately equal to a permeability of the core of the second impedance segment and exhibits a loss characteristic approximately equal to a loss characteristic of the core of the second impedance segment.

The invention and its particular features and advantages will become more apparent from the following detailed description considered with reference to the accompanying drawings.

DETAILED DESCRIPTION OF AN EMBODIMENT OF THE INVENTION

Figure 1:
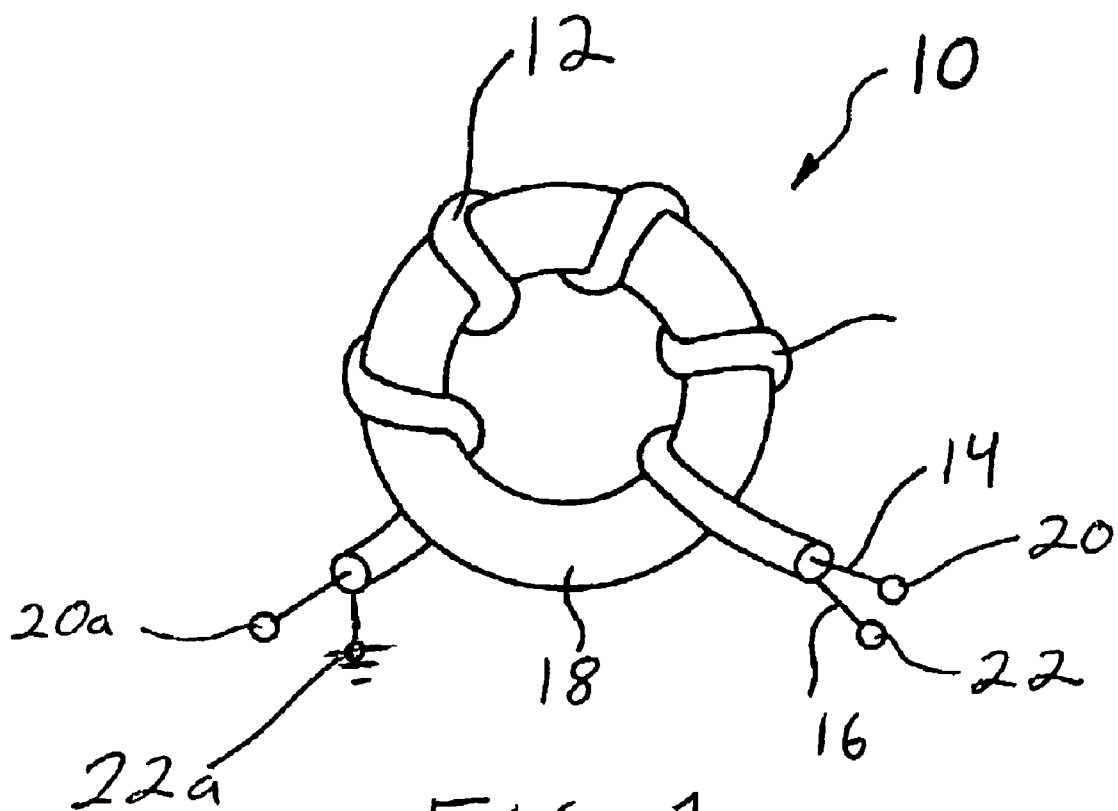
FIG. 1 is a hybrid plan view and circuit diagram showing a balun transformer in accordance with a known prior art design.
Figure 2:
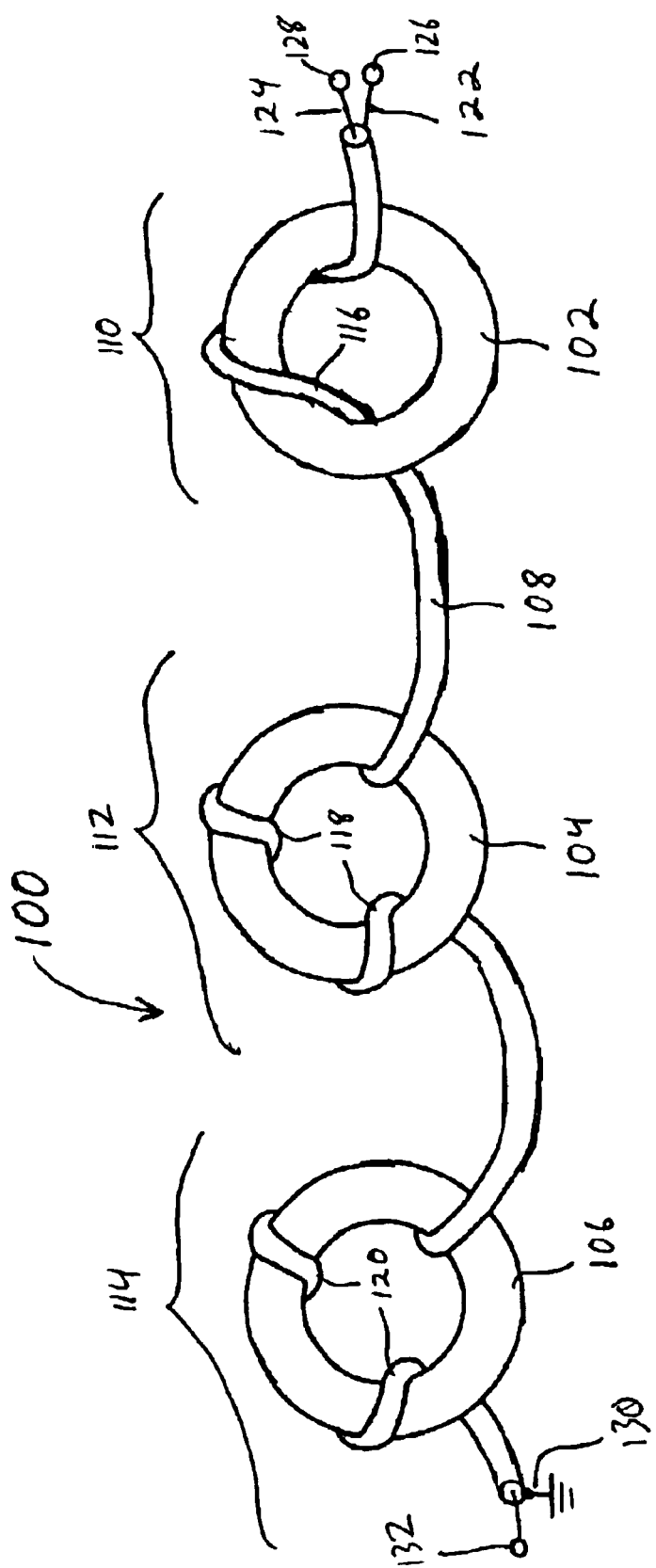
FIG. 2 is a hybrid plan view and circuit diagram showing a balun transformer in accordance with the present invention.

Referring now to FIG. 2, a segmented balun transformer 100 in accordance with the present invention is shown. Balun transformer 100 includes three toroidal cores 102, 104, 106 of high permeability magnetic material around which a serial coiled arrangement of coaxial transmission line 108 is wound. Each segment 110, 112, 114, consisting of a core 102, 104, 106 and its windings 116, 118, 120, produces a relatively high longitudinal choking impedance on the outer surface of the transmission line outer conductor 122 or shield. This impedance inhibits the flow of longitudinal or non transmission line mode current.

In FIG. 2, three segments 110, 112, 114 are series connected so that the total impedance between ends of balun 100 is the sum of the three impedances. It should be understood, however, that greater or fewer segments may be provided, so long as at least two segments connected in series are provided, such an arrangement providing advantages over known prior art baluns.

Starting at the balanced end of balun 100, outer conductor 122 and inner conductor 124 form the balanced terminals 126, 128 of balun 100. Core 102 and its windings 116 form the first impedance segment 110 of balun 100. The windings 116 of coaxial transmission line 108 on core 102 should be relatively few to avoid parasitic effects while enough to raise the magnitude of the impedance and choke off non transmission line current over the high frequency end of the operational frequency range. Core 102 is chosen to exhibit a relatively high permeability and moderate loss characteristics. Like all others, core 102 should be somewhat lossy at high frequencies where series resonances involving stray capacitances may occur. At the high frequency end of the operational range the remainder of the segments function substantially as a transmission line.

The second impedance segment 112, formed by core 104 and its windings 118, form another impedance component of balun 100. The number of windings 118 of coaxial transmission line 108 on core 104 should preferably be greater than on core 102, consistent with minimizing parasitic effects over the mid frequency range of balun 100. Core 104 can be similar to core 102 or of higher permeability and exhibiting a somewhat higher loss characteristics. First impedance segment 110 and second impedance segment 112 act in series to inhibit the flow of non transmission line current in the mid range. Third impedance segment 114 (and further impedance segments, if provided) function substantially as a length of transmission line over the mid range of balun 100.

The third impedance segment 114, formed by core 106 and its windings 120, form another impedance component of balun 100. The number of windings 120 of coaxial transmission line 108 on core 106 should preferably be similar to or somewhat greater than on core 104, consistent with minimizing parasitic effects over the lower frequency range of balun 100. Core 106 can be similar to core 104. The impedance of all segments in series inhibits the flow of non transmission line current over the low range. Leads 130 and 132 form the unbalanced end of the balun 100, with lead 130 being connected to common ground.

The loss characteristics of cores 102, 104, 106 eliminate the possibility of any resonance within the operational frequency range of balun 100 which would be present with low loss material used in prior art baluns. The inter winding capacity, which can have the effect of reducing overall impedance at some frequencies, form a series arrangement in segmented balun 100 so that the total capacity is less than that of any segment. The problem with in band resonances associated with prior art baluns which require structures of very short electrical length is eliminated with segmented balun 100. Electrical lengths of several wavelengths are possible making it practical to construct large high power structures to very high frequencies.

Figure 3:
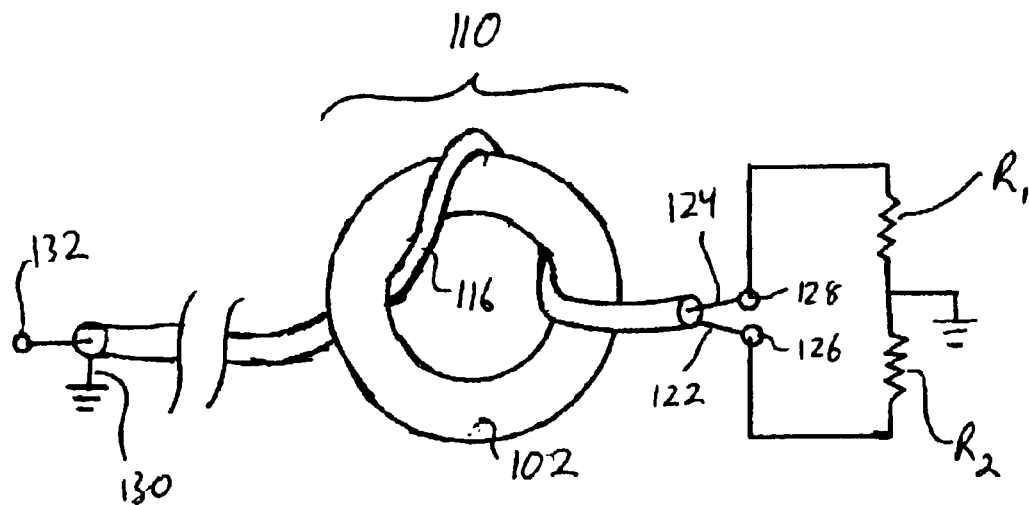
FIG. 3 is a hybrid plan view and circuit diagram showing a first embodiment of how the balanced end of the balun transformer of FIG. 2 may be terminated.

FIG. 3 is a partial view of FIG. 2 showing only first impedance segment 110 of balun 100, second impedance segment 112 and third impedance segment 114 not being shown for the sake of simplicity. Resistors $R_1$ and $R_2$ represent the balanced load terminating the balanced end of balun 100, with $R_1$ and $R_2$ having an equal resistance, the sum series of which equals resistance R. The impedance terminating either conductor 122 or conductor 124 is thus R/2 ohms to ground. Thus, for example, if a standard 50 ohm transmission line is employed for a 50 ohm balun, when either end is terminated in its characteristic impedance, 50 ohms, the impedance at the other end is also 50 ohms. $R_1$ and $R_2$ would each be 25 ohms, or 50 ohms total from conductor 122 to conductor 124, and the impedance terminating either conductor 122 or conductor 124 is 25 (i.e., 50/2) ohms to ground.

Figure 4:
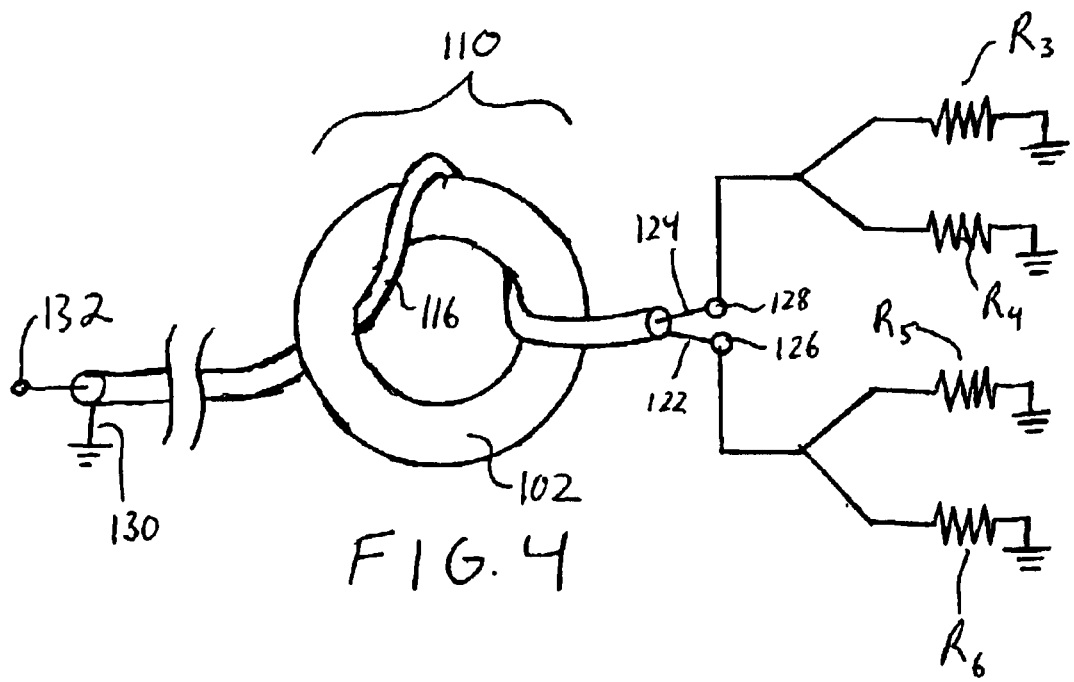
FIG. 4 is a hybrid plan view and circuit diagram showing a second embodiment of how the balanced end of the balun transformer of FIG. 2 may be terminated.

Referring now to FIG. 4, the same partial view of segmented balun 100 is shown wherein balun 100 is employed as a four way power divider. It should be understood by those skilled in the art that the same device may be employed as a power divider or combiner. Resistors $R_3$, $R_4$, $R_5$ and $R_6$, each having an equal resistance R, represent four loads connected to the balanced end of balun 100 so that the impedance terminating either conductor 122 or 124 is thus R/2 ohms to ground. The input impedance at the unbalanced end of the balun is also R ohms. Input power applied to the unbalanced end of balun 100 divides equally between the four R ohm loads, there being a 180 degree phase relationship between the loads connected to conductor 122 and the loads connected to conductor 124. Thus, for example, if a standard 50 ohm transmission line is employed for a 50 ohm balun, each of $R_3$, $R_4$, $R_5$ and $R_6$ would comprise 50 ohm loads so that the impedance terminating conductor 122 or conductor 124 is 25 (i.e., 50/2) ohms to ground. The input impedance at the unbalanced end of the balun is also 50 ohms.

Segmented balun 100 can be used advantageously to increase the operational bandwidth and power rating of many prior art power combiners/dividers employing transmission line sections and magnetic cores. Replacing transmission line balun sections with segmented baluns can result in 10:1 or greater increase in bandwidth, and with the fractional wavelength restriction removed large structures employing large magnetic cores and large high power transmission lines can be used. Some prior art power combiners where the segmented balun may be employed are described, for example, in U.S. Pat. No. 3,317,849 to Smith-Vaniz, U.S. Pat. No. 4,774,481 to Edwards, and U.S. Pat. No. 6,407,648 to Johnson.

More specifically, balun 100 in accordance with the present invention can be employed in several type power divider/combiner circuits which exhibit useful bandwidths of 10,000:1 or more and power levels of 15 kW or greater. Moreover, balun 100 can be employed, as example only, at very high power levels over a bandwidth of 0.1–250 MHz and moderate power levels of one kilowatt or more over a bandwidth of 0.05–500 MHz.

The present invention, therefore, provides a very high power, ultra wideband balun featuring parasitic reduction and techniques to extend both the high and low frequency ends of the useful range.

Although the invention has been described with reference to a particular arrangement of parts, features and the like, these are not intended to exhaust all possible arrangements or features, and indeed many other modifications and variations will be ascertainable to those of skill in the art.

What is claimed is:

1. A balun transformer comprising:
   a coaxial transmission line terminating at one end with balanced terminals and terminating at another end with unbalanced terminals; and
   at least two impedance segments connected in series between the balanced terminals and the unbalanced terminals, each of said at least two impedance segments comprising:
      a magnetic core; and
      at least one winding of said coaxial transmission line wound about said magnetic core.

2. The balun transformer of claim 1 wherein each of said magnetic cores is toroidal in shape.

3. The balun transformer of claim 1 wherein each of said magnetic cores is formed from a ferrite material.

4. The balun transformer of claim 1 wherein said at least two impedance segments comprises two impedance segments.

5. The balun transformer of claim 1 wherein said at least two impedance segments comprises three impedance segments.

6. The balun transformer of claim 1 wherein said at least two impedance segments comprises:
   a first impedance segment connected to the balanced terminals;
   a second impedance segment connected between said first impedance segment and the unbalanced terminals; and
   wherein a number of windings of said coaxial transmission line wound about the core of said second impedance segment is greater than a number of windings of said coaxial transmission line wound about the core of said first impedance segment.

7. The balun transformer of claim 6 wherein said at least two impedance segments further comprises:
   a third impedance segment connected between said second impedance segment and the unbalanced terminals; and
   wherein a number of windings of said coaxial transmission line wound about the core of said third impedance segment is greater than or equal to a number of windings of said coaxial transmission line wound about the core of said second impedance segment.

8. The balun transformer of claim 1 wherein said at least two impedance segments comprises:
   a first impedance segment connected to the balanced terminals;
   a second impedance segment connected between said first impedance segment and the unbalanced terminals; and
   wherein the core of said second impedance segment has a permeability greater than or equal to a permeability of the core of said first impedance segment and exhibits a loss characteristic greater than or equal to a loss characteristic of the core of said first impedance segment.

9. The balun transformer of claim 8 wherein said at least two impedance segments further comprises:
   a third impedance segment connected between said second impedance segment and the unbalanced terminals; and
   wherein the core of said third impedance segment has a permeability approximately equal to a permeability of the core of said second impedance segment and exhibits a loss characteristic approximately equal to a loss characteristic of the core of said second impedance segment.

10. A balun transformer comprising:
    a coaxial transmission line terminating at one end with balanced terminals and terminating at another end with unbalanced terminals;
    a first impedance segment connected to the balanced terminals, said first impedance segment comprising a magnetic core and at least one winding of said coaxial transmission line wound about the magnetic core; and
    a second impedance segment connected in series between said first impedance segment and the unbalanced terminals, said second impedance segment comprising a magnetic core and at least one winding of said coaxial transmission line wound about the magnetic core.

11. The balun transformer of claim 10 wherein each of said magnetic cores is toroidal in shape.

12. The balun transformer of claim 10 wherein each of said magnetic cores is formed from a ferrite material.

13. The balun transformer of claim 10 wherein a number of windings of said coaxial transmission line wound about the core of said second impedance segment is greater than a number of windings of said coaxial transmission line wound about the core of said first impedance segment.

14. The balun transformer of claim 10 wherein the core of said second impedance segment has a permeability greater than or equal to a permeability of the core of said first impedance segment and exhibits a loss characteristic greater than or equal to a loss characteristic of the core of said first impedance segment.

15. A balun transformer comprising:
    a coaxial transmission line terminating at one end with balanced terminals and terminating at another end with unbalanced terminals;
    a first impedance segment connected to the balanced terminals, said first impedance segment comprising a magnetic core and at least one winding of said coaxial transmission line wound about the magnetic core;
    a second impedance segment connected in series with said first impedance segment, said second impedance segment comprising a magnetic core and at least one winding of said coaxial transmission line wound about the magnetic core; and a third impedance segment connected in series with said second impedance segment and the unbalanced terminals, said third impedance segment comprising a magnetic core and at least one winding of said coaxial transmission line wound about the magnetic core.

16. The balun transformer of claim 15 wherein each of said magnetic cores is toroidal in shape.

17. The balun transformer of claim 15 wherein each of said magnetic cores is formed from a ferrite material.

18. The balun transformer of claim 15 wherein a number of windings of said coaxial transmission line wound about the core of said second impedance segment is greater than a number of windings of said coaxial transmission line wound about the core of said first impedance segment, and wherein a number of windings of said coaxial transmission line wound about the core of said third impedance segment is greater than or equal to a number of windings of said coaxial transmission line wound about the core of said second impedance segment.

19. The balun transformer of claim 15 wherein the core of said second impedance segment has a permeability greater than or equal to a permeability of the core of said first impedance segment and exhibits a loss characteristic greater than or equal to a loss characteristic of the core of said first impedance segment, and wherein the core of said third impedance segment has a permeability approximately equal to a permeability of the core of said second impedance segment and exhibits a loss characteristic approximately equal to a loss characteristic of the core of said second impedance segment.

20. A power combiner/divider comprising a balun transformer, said balun transformer comprising:
   a coaxial transmission line terminating at one end with balanced terminals and terminating at another end with unbalanced terminals; and
   at least two impedance segments connected in series between the balanced terminals and the unbalanced terminals, each of said at least two impedance segments comprising:
      a magnetic core; and
      at least one winding of said coaxial transmission line wound about said magnetic core.

21. The balun transformer of claim 20 wherein each of said magnetic cores is toroidal in shape.

22. The balun transformer of claim 20 wherein each of said magnetic cores is formed from a ferrite material.

23. The balun transformer of claim 20 wherein said at least two impedance segments comprises two impedance segments.

24. The balun transformer of claim 20 wherein said at least two impedance segments comprises three impedance segments.

25. The balun transformer of claim 20 wherein said at least two impedance segments comprises:
   a first impedance segment connected to the balanced terminals;
   a second impedance segment connected between said first impedance segment and the unbalanced terminals; and
   wherein a number of windings of said coaxial transmission line wound about the core of said second impedance segment is greater than a number of windings of said coaxial transmission line wound about the core of said first impedance segment.

26. The balun transformer of claim 25 wherein said at least two impedance segments further comprises:
   a third impedance segment connected between said second impedance segment and the unbalanced terminals; and
   wherein a number of windings of said coaxial transmission line wound about the core of said third impedance segment is greater than or equal to a number of windings of said coaxial transmission line wound about the core of said second impedance segment.

27. The balun transformer of claim 20 wherein said at least two impedance segments comprises:
   a first impedance segment connected to the balanced terminals;
   a second impedance segment connected between said first impedance segment and the unbalanced terminals; and
   wherein the core of said second impedance segment has a permeability greater than or equal to a permeability of the core of said first impedance segment and exhibits a loss characteristic greater than or equal to a loss characteristic of the core of said first impedance segment.

28. The balun transformer of claim 27 wherein said at least two impedance segments further comprises:
   a third impedance segment connected between said second impedance segment and the unbalanced terminals; and
   wherein the core of said third impedance segment has a permeability approximately equal to a permeability of the core of said second impedance segment and exhibits a loss characteristic approximately equal to a loss characteristic of the core of said second impedance segment.

* * * * *